United States Patent
King et al.

(10) Patent No.: US 6,813,150 B2
(45) Date of Patent: Nov. 2, 2004

(54) COMPUTER SYSTEM

(75) Inventors: James Edward King, Wokingham (GB); Rhod James Jones, Crowthorne (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/216,537

(22) Filed: Aug. 9, 2002

(65) Prior Publication Data

US 2004/0027799 A1 Feb. 12, 2004

(51) Int. Cl.$^7$ ................................................. G06F 1/20
(52) U.S. Cl. ...................... 361/687; 361/697; 165/80.3; 165/104.33; 415/177; 415/214.1; 713/300; 713/324
(58) Field of Search .................. 361/687, 683, 361/724–727, 695, 697; 165/121–126, 80.3, 104.33; 415/177, 178, 213.1, 214, 214.1; 713/300, 322–324

(56) References Cited

U.S. PATENT DOCUMENTS

| | | | |
|---|---|---|---|
| 6,058,012 A | | 5/2000 | Cooper et al. |
| 6,134,667 A | * | 10/2000 | Suzuki et al. ............... 713/300 |
| 6,182,742 B1 | * | 2/2001 | Takahashi et al. ..... 165/104.33 |
| 6,266,721 B1 | * | 7/2001 | Sheikh et al. ............... 710/100 |
| 6,318,965 B1 | * | 11/2001 | Nair .............................. 417/2 |
| 6,349,385 B1 | * | 2/2002 | Kaminski et al. ........... 713/300 |
| 6,400,045 B1 | * | 6/2002 | Hosokawa et al. ......... 361/695 |
| 6,414,843 B1 | * | 7/2002 | Takeda ........................ 361/687 |
| 6,470,289 B1 | * | 10/2002 | Peters et al. ................ 702/132 |
| 6,493,827 B1 | * | 12/2002 | Mueller et al. ............. 713/300 |
| 6,528,987 B1 | | 3/2003 | Blake et al. |
| 2002/0042896 A1 | | 4/2002 | Johnson et al. |
| 2003/0023887 A1 | | 1/2003 | Maciorowski et al. |

FOREIGN PATENT DOCUMENTS

GB   2371380   7/2002

OTHER PUBLICATIONS

International search report application No. GB 0318830.7 mailed Jan. 28, 2004.

* cited by examiner

*Primary Examiner*—Lisa Lea-Edmonds
(74) *Attorney, Agent, or Firm*—Meyertons Hood Kivlin Kowert & Goetzel, P.C.; B. Noël Kivlin

(57) ABSTRACT

A computer system comprises a host processor, a temperature sensor for sensing temperature in an enclosure of the system and one or more fans for cooling the enclosure. A service processor is provided for providing system management functions within the computer system. These include generating fan speed signals in response to temperature values detected by the temperature sensor, and generating a control signal. The system includes a fan controller for providing power for driving the fan or at least one of the fans in response to the fan speed signals generated by the service processor only when the fan controller also receives the control signal from the service processor. In the absence of the control signal from the service processor, the fan controller will increase the fan speed to a predetermined fan speed, for example maximum, in order to ensure that no damage occurs in the event of a service processor malfunction.

22 Claims, 5 Drawing Sheets

COMPUTER SYSTEM

BACKGROUND OF THE INVENTION

This invention relates to computer systems, and especially to computer systems that are employed as servers.

The systems may for instance be employed as servers for example in local area networks (LANS) or in wide area networks (WANs), telecommunications systems or other operations such as database management or as internet servers. Such servers may be used in so-called "horizontally scaled" applications in which tens or hundreds of corresponding servers are employed as part of a distributed system.

A typical computer employed for such purposes will comprise two or more processors mounted on a motherboard, together with power supply units (PSUs), and other components such as hard disc drives (HDDs), fans, digital video disc (DVD) players, memory modules, ethernet ports etc. One or more of the processors, the host processor (s), provides the main functions of the server, and may communicate with a number of peripheral components, including communication ports, optionally via peripheral component interconnect (PCI) bridges in order to provide server operation. One of those peripheral components, called the "South Bridge" further allows the host processors to communicate with internal devices via serial interfaces one of which transports the console interface of the processors.

In addition to the host processor(s), the system may include another processor, called the service processor or the remote management controller (RMC), which provides management functions for the system assembly. Such functions may include environmental monitoring, temperature monitoring of the enclosure, fan speed control, data logging and the like. The service processor may communicate with the host processor or with one of the host processors, and may also have one or more external communication ports so that a user or network administrator can communicate with the service processor, or can communicate with the host processor(s) via the service processor. For example, the service processor may have its own ethernet network port for direct communication to the network administrator.

Fan speed is controlled by the service processor in order to minimise the amount of vibration and noise in the neighbourhood of the equipment, and, more importantly, in order to increase the life of the fans. With proper fan speed control, it is possible to extend the life of the fans by an order of magnitude or more, so that the fan lifetime is generally equivalent to that of the computer system. This is advantageous in the case of those systems in which it may not be possible to change the fans without shutting the system down, since any change of fans will be associated with downtime of the system.

In addition, in order to reduce the amount of downtime of the system, it is desirable to enable the system to continue to function in the event of a failure of the service processor for whatever reason. However, when the service processor has malfunctioned, all system management functions that are provided by the service processor are lost.

SUMMARY OF THE INVENTION

According to one aspect of the present invention, there is provided a computer system which comprises:

(i) a host processor;
(ii) a temperature sensor for sensing temperature in or in relation to an enclosure of the system;
(iii) one or more fans for cooling the enclosure;
(iv) a service processor for providing system management functions within the computer system, including generating fan speed signals in response to temperature values detected by the temperature sensor, and generating a control signal; and
(v) a fan controller for providing a driving signal for the fan or at least one of the fans in response to the fan speed signals generated by the service processor only when the fan controller also receives the control signal from the service processor;

wherein, in the absence of the control signal from the service processor, the fan controller will alter the driving signal to increase the fan speed to a predetermined fan speed.

Thus, the system according to the invention has the advantage that, under normal circumstances, the system will operate with dynamic control of the fans, but, should the system management functions be lost due to a malfunction of the service controller, the fan speed will be increased in order to ensure adequate cooling of the system enclosure.

The control signal may, for example, simply be a voltage level that is generated on a control line from the service processor, which may be inverted, if required, depending on the design of the service processor and the requirements of the fan controller. In such a case, a pull-up resistor may be provided between the control line and a voltage rail, or a pull-down resistor provided between the control line and earth, so that the signal on the control line will be as supplied by the service processor unless and until the service processor fails, in which case the voltage on the line will be governed by the pull-up or pull-down resistor. Alternatively a switch, for example a solid state switch, may be provided that is controlled by the control signal from the service processor and whose output is sent to the fan controller.

Although the fans may be driven to any speed that will provide an adequate margin of safety from thermal damage to the equipment, the fan controller may, for example, increase the fan speed to the maximum that can be driven by the fan controller. For example, the fan controller may provide a fan driving signal as a pulse-width-modulated (pwm) signal with a pulse width varying between, for example, 0 (i.e. off) and 100% (maximum speed), in which case, the fan controller may output a 100% pulse width, i.e. a constant d.c. voltage, when no control signal is received from the service processor.

The control line from the service processor may perform a number of functions in addition to controlling the fan controller. For example it may also control a management communication device, e.g. an external port such as an ethernet port, to enable the communication device to send and receive data only when it receives the control signal from the service processor. For example, the management communication device may be used to send system management information to a remote network administrator and to receive instructions therefrom. Such an arrangement has the advantage that the system administrator will become aware of the malfunction of the service processor by virtue of the inability of the management communication device to send or receive data.

Thus, according to another aspect of the invention, there is provided a network which includes at least one computer server comprising:

(i) a host processor;

(ii) a temperature sensor for sensing temperature in an enclosure of the system;
(iii) one or more fans for cooling the enclosure;
(iv) a service processor for providing system management functions within the computer system, including generating fan speed signals in response to temperature values detected by the temperature sensor, and generating a control signal;
(v) a fan controller for providing power for driving the fan or at least one of the fans in response to the fan speed signals generated by the service processor only when the fan controller also receives the control signal from the service processor; and
(vi) a management communication device that can communicate with the service processor and with a network administrator only when it receives the control signal from the service processor;

wherein, in the absence of the control signal from the service processor, the fan controller will increase the fan speed to a predetermined fan speed.

According to yet another aspect of the invention, there is provided a method of operating a computer system which comprises:

(i) measuring air temperature in or in relation to an enclosure of the system and sending measured air temperature data to a service processor of the system;
(ii) sending fan speed signals generated by the service processor in response to the air temperature data to a fan controller together with a control signal generated by the service processor;
(iii) sending fan driving signals generated by the fan controller to at least one fan so that it is driven at a rate determined by the service processor in accordance with the measured temperature if and only if the control signal is received by the fan controller; and
(iv) sending a fan driving signal to the or at least one fan to increase the speed of the fan to a constant value if no control signal is received from the service processor by the fan controller.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
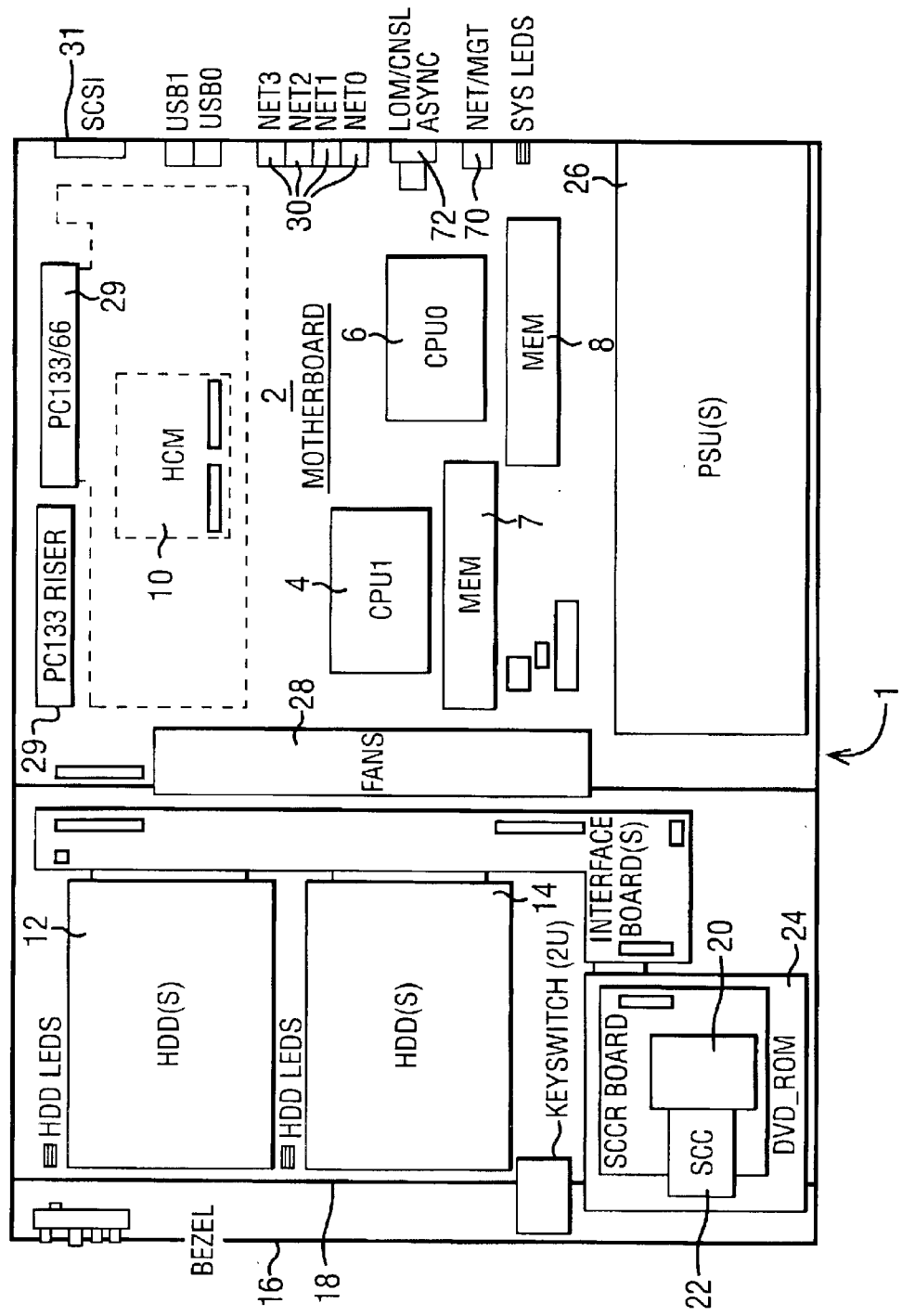
FIG. 1 is a physical plan view of one form of computer system according to one aspect of the present invention.

Referring now to the drawings, in which like reference numerals are used to designate corresponding elements, FIG. 1 shows a physical plan view of a narrow form factor computer that is intended to provide a rack mounted server for use with the internet or as part of a local area network (LAN) or for other telecommunications purposes, and is designed to fit into, for example a nineteen inch rack electronics cabinet. Other sizes may alternatively be employed, for example to fit into 23 inch or metric racks. The assembly may be designed to be a so-called high "RAS" system, that is to say, to have high reliability, availability and serviceability. As such, it is intended that the system will be operated with the minimum amount of down time.

The computer comprises an enclosure 1 that contains a motherboard 2 in the form of a printed circuit board (PCB) designed in a custom form-factor to fit the enclosure 1 and chosen to minimise the cabling withing the enclosure. The motherboard 2 carries the majority of circuitry within the computer. On the motherboard are mounted one or more (in this case two) host processors or central processing units (CPUs) 4 and 6, each of which is provided with its own dedicated cooling in the form of an impingement fan that clips onto the CPU socket. Each processor 4, 6 is provided with its own dedicated block of memory 7, 8, for example provided in the form of one or two banks of dual in-line memory modules (DIMMS) with a total of 256 MB to 16 GB block capacity although other forms and sizes may be used.

A hardware cryptographic module (HCM) 10 may also be located on the motherboard. The HCM may be provided on a mezzanine card which plugs directly into the motherboard, and contains a co-processor providing cryptographic protocol acceleration support for security algorithms used in private community applications.

Two hard disc drives (HDDs) 12 and 14 are located at the front of the computer behind the front bezel 16. The drives are hot-pluggable and are accessible by removal of the bezel and EMI shield 18. Two internal HDDs plug directly into the motherboard via right-angled connectors located on the front edge of the motherboard 2.

Next to the HDDs is arranged a system configuration card reader (SCCR) 20 that is able to read a system configuration card (SCC) 22 inserted therein. The SCC contains all relevant information concerning the computer, so that it is possible to replace one computer with another simply by inserting the original SCC into the new computer and replacing the hard disc drives with those of the original computer.

A removable media drive bay is provided to allow optional fitting of a slimline (notebook style) digital video disc or digital versatile disc (DVD) drive 24 for reading CD and DVD media. The media transport loader is accessible through a slot in the enclosure bezel 16.

One or two 320 W or 400 W custom power supply units (PSUs) 26 are also provided. In addition to the dedicated CPU fans, the assembly is cooled by means of a row of fans 28 mounted between the motherboard and the media drive bays.

The computer supports input/output (I/O) expansion by means of peripheral component interconnect (PCI) cards that plug into expansion slots. These are accommodated by means of riser cards 29 that plug directly into the motherboard 2.

A number of I/O interfaces and sockets are provided along the rear surface of the enclosure 1, including four ethernet ports 30, a network management ethernet port 70, and a serial port 72. The network management ethernet port 70 and the serial port 72 allow user access to the service processor and system console.

Figure 2:
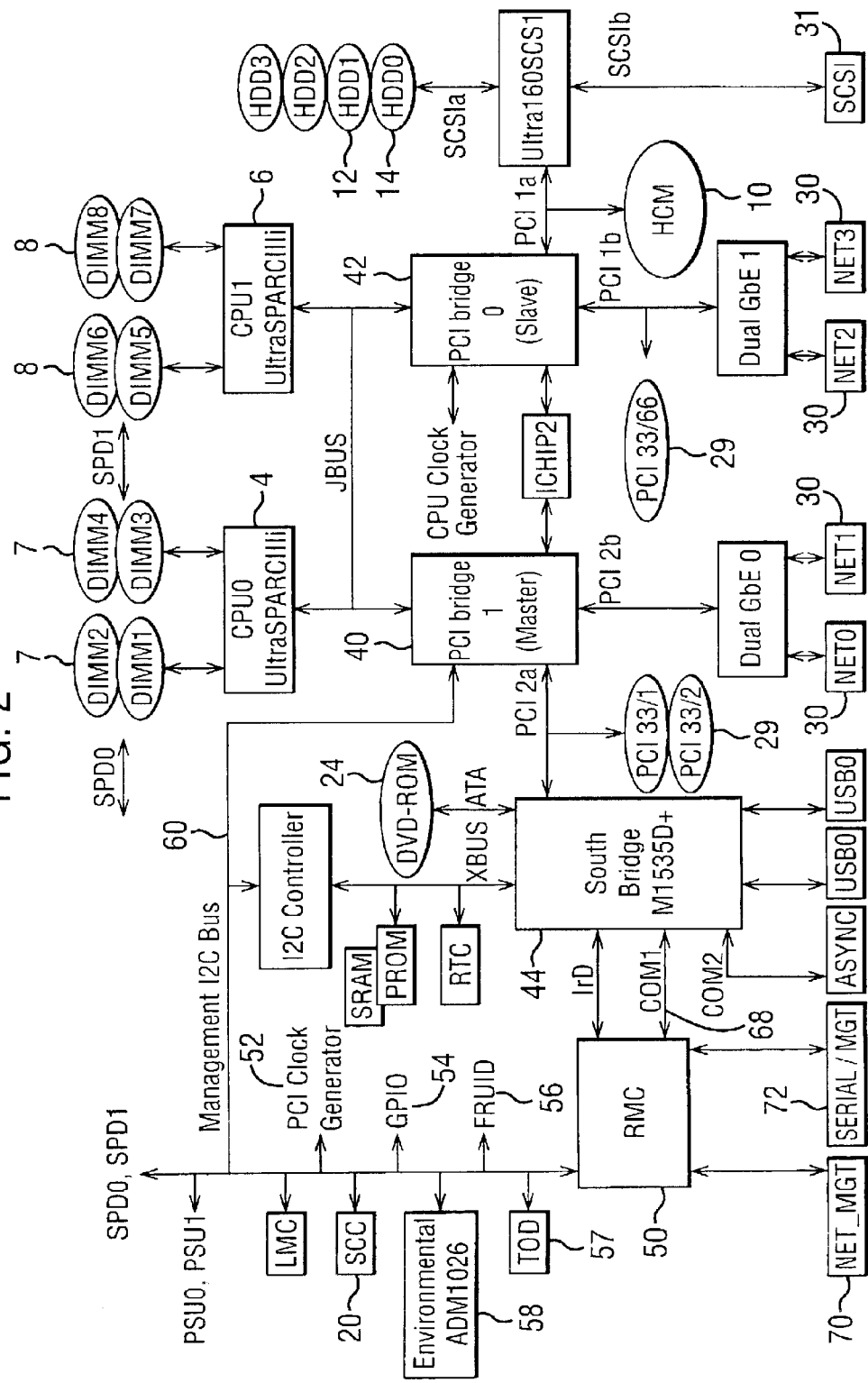
FIG. 2 is a schematic block diagram showing the system architecture of the system of FIG. 1.

FIG. 2 is a schematic representation of the system architecture of the computer system according to the invention.

Two host processors or CPUs 4 and 6 available from Sun Microsystems under the name UltraSPARCIIIi have an integer execution unit, a floating point and graphics unit, 32 kB level 1 instruction cache, 64 kB level 1 data cache, 1 MB (256 k×32) level 2 data cache, a memory controller with error correction code (ECC) and an interface controller for the processor bus. Four DIMM sockets 7 and 8 are associated with each CPU.

The CPUs 4, 6 are connected to two PCI bridges 40, 42 which-provide interfaces to independent 64 bit PCI buses leading to various peripheral components such as the riser cards 29, HDDs 12 and 14, the HCM 10 etc. The PCI bridge 40 is also connected to a PCI I/O device 44 available from Acer Labs under the product code M1535D+ also referred to as "South Bridge". This is an integrated PCI sub system which provides an integrated drive electronics (IDE) controller, a universal serial bus (USB) controller, independent universal asynchronous receiver/transmitters (UARTs), XBUS bridge and a power management controller. The PCI I/O device 44 also provides the console interface for enabling user access to the host processors 4 and 6.

A service processor or remote management controller (RMC) 50 is included for providing local and remote management services. Such services may include one or more of the following system functions:

1) power management control,
2) environmental monitoring,
3) enclosure management and event logging
4) fan control,
5) voltage rail monitoring, and
6) system status monitoring.

Figure 3:
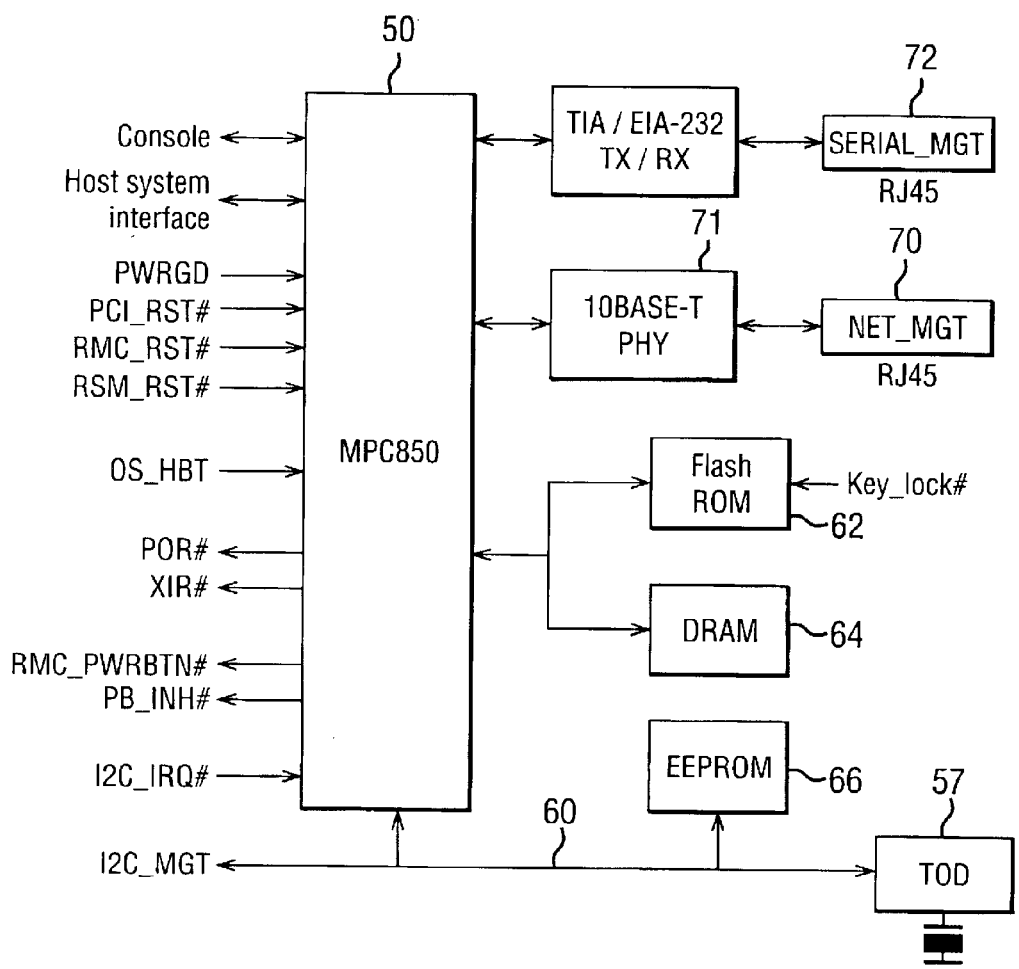
FIG. 3 is a schematic diagram showing the service processor employed in the present invention.

Other service functions may be included if desired. The service processor is also responsible for monitoring and reporting the operational status of the system. The processor operates from the +5V rail and is capable of power cycling and resetting of the host system. It is based on an MPC850 PowerPC design with dedicated flash ROM 62 and synchronous dynamic RAM (SDRAM) 64, although any of a number of other processors may be employed. Peripheral devices that are required for the management functions, may include the system configuration card (SCC) reader 20, PCI clock generator 52, general purpose IO (GPIO) devices 54 field replaceable unit identification (FRUID) devices 56, a "time-of-day" real time clock 57, and a system temperature monitor 58. These may be provided by a dedicated IC, in this case an Analogue Devices ADM1026 IC, although others may be used. These devices are provided on an inter-integrated circuit (I2C) management bus 60. As shown in FIG. 3, in addition to the flash ROM and SDRAM, the service controller can access electrically erasable programmable ROM (EEPROM) 66 that is provided in the temperature monitor 58 via the I2C management bus 60.

Figure 4:
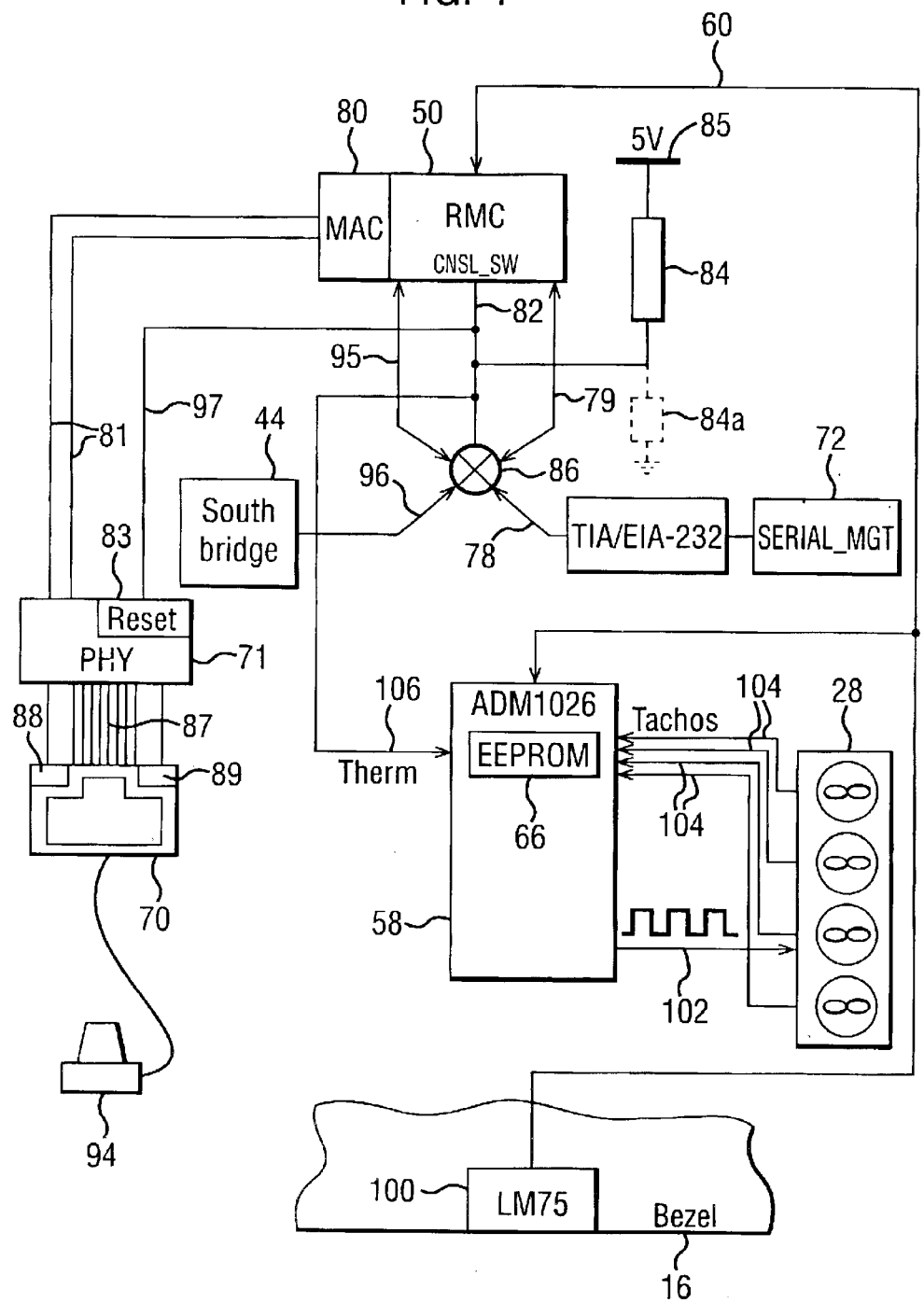
FIG. 4 is a schematic diagram showing the interconnection between the service processor and certain peripheral components of the system.

FIG. 4 shows the connection between various components of the system including the service processor 50 and the temperature monitor 58. The temperature monitor IC does, in fact, have its own junction internal temperature monitor, but this is not used for the purposes of temperature sensing in the system according to the invention because sensing temperature within the enclosure is extremely sensitive to the positioning of other components within the enclosure and to changes of the components. For this reason, a separate silicon band gap temperature monitor 100 available from National Semiconductors under the product code LM75 is employed. This temperature monitor is located in the front bezel 16 so that it measures the temperature of the external air that is introduced into the enclosure rather than that of air within the enclosure. The temperature value is encoded by the monitor 100 into an eight bit word and is sent to the service processor 50 along the I2C management bus 60 when requested by the processor.

Figure 5:
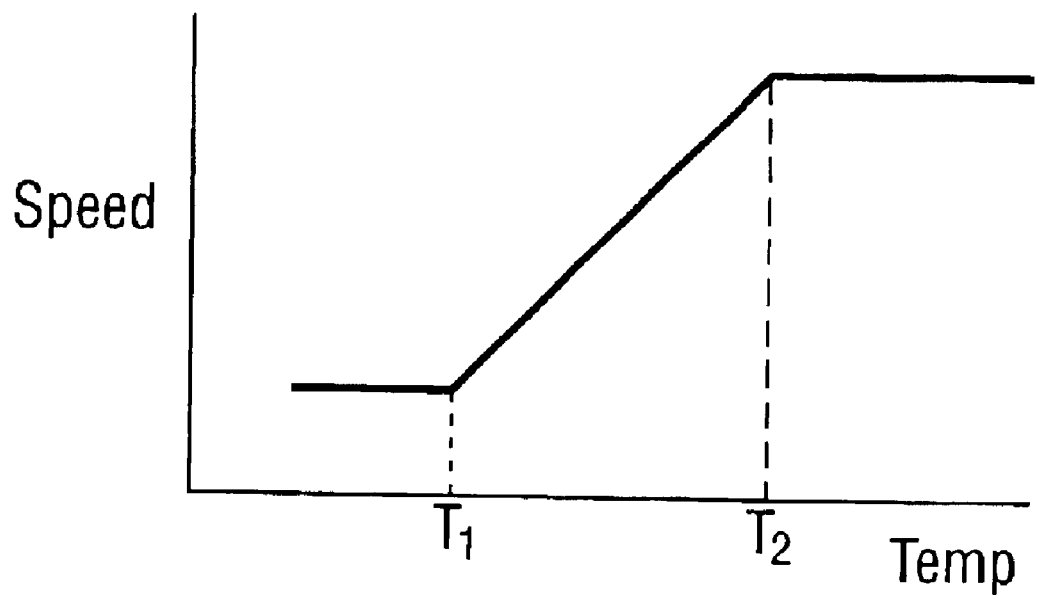
FIG. 5 is a graphical representation of the fan speed and air temperature measured by the temperature sensor.

The processor then calculates the desired fan speed in accordance with a speed table that has been input into the service processor memory, for example into the EEPROM 66 of the temperature monitor 58. FIG. 5 shows an example of such a speed requirement. The fan speed required is relatively low, and constant with respect to temperature, until a first temperature $T_1$ at which point the required fan speed increases linearly with temperature until temperature $T_2$ is reached, when, again, a speed that is constant with respect to temperature is required. The upper constant speed above $T_2$ may well be because the fans 28 are already running at maximum speed. The precise values of temperatures $T_1$ and $T_2$ will vary depending on the enclosure design, the fans and the other components.

The service processor then sends the required fan speed value to the temperature monitor 58 via the I2C management bus 60, whereupon it is converted to a pulse width modulated (PWM) signal and sent to the control input of the fan unit 28 along line 102.

The temperature monitor 58 also provides counter inputs which are used to monitor the rotational speed of all the fans within the enclosure, not only the enclosure fans 28, but also the dedicated fans for the CPUs. The fans provide tachometer output signals for this purpose, along lines 104. The signals are open-drain and two pulse-per-revolution logic format. The service processor compares the measured speed values against minimum thresholds and issues alerts when required.

As described, the service processor runs the enclosure fans 28 under open-loop control in accordance with the fan speed requirement given in FIG. 5. The service processor could, if desired, run the fans under closed-loop control, for example by reading the tachometer data supplied to the temperature monitor 58 along lines 104 and taking the difference between the tachometer readings and a demanded tachometer level.

A control line 82 (CNSL_SW) extends from the service processor 50 to the thermal reset input (THERM) 106 of the temperature monitor 58. The control line 82 is also connected to a pull-up resistor 84 connected to the positive 5V rail 85. The control line will be held down to earth voltage by the service processor 50 once the service processor is booted up, but, should the service processor fail for any reason, whether a hardware or a software failure, the control line 82 voltage will rise to the 5V rail due to its connection via the pull-up resistor. This voltage is then fed into the thermal reset input of the temperature monitor 58 which then sets the signal on the fan speed line 102 to maximum (i.e. a pulse width of 100%).

As an alternative to the pull-up resistor 84, a pull-down resistor 84a may be employed that is connected between the control line 82 and earth. In this case the service processor 50 would hold the control line 82 at same voltage level unless it failed in which case the control line voltage would fall to earth potential.

As well as monitoring the environment and managing the peripheral devices, the service processor can communicate with the PCI I/O device or console interface 44 by means of serial port 68. User access to the service processor 50 is available either through the 10BASE-T ethernet port 70, (NET_MGT), or through the serial port 72 (SERIAL_MGT). In this way, remote user access is available either to the service processor 50 for management functions, or to the host processor(s) 4 and 6 via the service processor 50. Remote user access, for example by the network administrator, will normally be obtained via the ethernet port 70, while local user access will normally be obtained via the serial port 72.

As shown in FIG. 4, signals from the service processor to the ethernet port 70 are controlled within the service processor by the media access controller 80 which handles the open systems interconnection (OSI) level 2 (data link layer) protocols, and are sent to the ethernet port 70 via a physical lines 81 and a physical interface or PHY 71 which provides power for sending the signals along the ethernet cabling, and provides other functions such as a clock, and line coding. Manchester encoding is employed in this case, but other forms of line coding may be used that are appropriate to the channel characteristics. The control line 82 (CNSL_SW) extends from the service processor to the reset input 83 of the PHY 71 for the management ethernet port.

Management data is transmitted between the PHY 71 and the ethernet port 70 by means of an eight conductor cable 87. In addition, LEDs 88, 89 on the RJ45 socket forming the ethernet port will light up, one LED indicating that the port is operative, and the other LED turning on whenever there is traffic on the line. Other forms of cable may be employed, depending on the form of the ethernet port, and indeed other forms of port may be used.

The control line 82 is also connected to a multiplexer 86 which controls signals between the serial port 72 (SERIAL_MGT) and the host processor I/O device 44. The multiplexer 86 routes the signals from the serial port 72 to the service processor 50 via lines 78, 79, 95 and 96 for handling by the service processor or for onward transmission to the host processor I/O device 44 when the control line 82 is held to earth by the service processor. If a fault occurs in the service processor 50 and the control line 82 rises to the 5V rail, the multiplexer 86 will transmit all signals directly between the serial port 72 and the host processor I/O device 44.

Thus, if the service processor 50 should fail, in addition to the fans 28 being turned to maximum speed, the ethernet management port 70 will become inoperative, which will alert the network administrator 94 to the existence of a fault in the server, and the host processor 4 may still be accessed from the serial port 72.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A computer system comprising: a host processor; a temperature sensor for sensing temperature in, or in relation to, an enclosure of the system; one or more fans for cooling the enclosure; a service processor that provides system management functions within the computer system, including generating fan speed signals in response to temperature values detected by the temperature sensor, and that generates a control signal; and a fan controller for providing a driving signal for at least one of the fans in response to the fan speed signals generated by the service processor only when the fan controller also receives the control signal from the service processor; wherein, in the absence of the control signal from the service processor, the fan controller will alter the driving signal to increase the fan speed to a predetermined fan speed.

2. A system as claimed in claim 1, wherein the control signal that is generated by the service processor is a voltage level on a control line.

3. A system as claimed in claim 2, wherein the control line is connected to a pull-up resistor or a pull-down resistor so that, in the absence of the control signal from the service processor, the voltage of the control line will be governed by the pull-up or pull-down resistor.

4. A system as claimed in claim 1, wherein, in the absence of the control signal form the service processor, the fan controller will increase the fan speed to the maximum that can be driven by the fan controller.

5. A system as claimed in claim 1, wherein the fan controller generates a pulse-width-modulated driving signal.

6. A system as claimed in claim 5, wherein, in the absence of the control signal from the service processor, the fan speed signal has a pulse width of 100%.

7. A system as claimed in claim 1, wherein the temperature sensor is located in the region of a wall of the enclosure.

8. A system as claimed in claim 1, wherein the temperature sensor is arranged to measure the temperature of air outside the enclosure that is drawn into the enclosure.

9. A system as claimed in claim 1, wherein the service processor generates the fan speed signals under open-loop control.

10. A system as claimed in claim 1, wherein the service controller generates fan speed signals to increase the speed of the fan(s) linearly with temperature, at least over a predetermined temperature range.

11. A system as claimed in claim 1, wherein the fan controller has a thermal reset input that is controlled by the control signal of the service processor.

12. A system as claimed in claim 1, wherein the fan controller forms part of an environmental management integrated circuit.

13. A system as claimed in claim 12, wherein the switching device will bypass the service processor when the control signal is not received from the service processor.

14. A system as claimed in claim 1, which includes a switching device that enables the service processor to communicate with the host processor only when the switching device receives the control signal from the service processor, in order to enable a user to communicate with the or at least one host processor via the service processor.

15. A system as claimed in claim 1, wherein the service processor provides one or more of the following system functions:
   1) power management control,
   2) environmental monitoring,
   3) enclosure management and event logging
   4) fan control,
   5) voltage rail monitoring, and
   6) system status monitoring.

16. A system as claimed in claim 1, which is a computer server.

17. A system as claimed in claim 1, which includes a management communication device that is controlled by the control signal from the service processor and is operative to send and receive data only when it receives the control signal.

18. A network which includes at least one computer system comprising: a host processor; a temperature sensor for sensing temperature in an enclosure of the one computer system; one or more fans for cooling the enclosure; a service processor that provides system management functions within the computer system, including generating fan speed signals in response to temperature values detected by the temperature sensor, and that generates a control signal; a fan controller for providing a driving signal for at least one of the fans in response to the fan speed signals generated by the service processor only when the fan controller also receives the control signal from the service processor; and a management communication device for communicating with the service processor and with a network administrator only when it receives the control signal from the service processor; wherein, in the absence of the control signal from the service processor, the fan controller will increase the fan speed to a predetermined fan speed.

19. A method of operating a computer system comprising:

measuring air temperature in or in relation to an enclosure of the system and sending measured air temperature data to a service processor of the system;

sending fan speed signals generated by the service processor in response to the air temperature data to a fan controller together with a control signal generated by the service processor;

sending fan driving signals generated by the fan controller to at least one fan so that it is driven at a rate determined by the service processor in accordance with the measured temperature if and only if the control signal is received by the fan controller; and sending a fan driving signal to the at least one fan to increase the speed of the fan to a constant value if no control signal is received from the service processor by the fan controller.

20. A method as claimed in claim 19 wherein, if no control signal is received by the fan controller, the fan controller increases the fan driving signal to a maximum value.

21. A method as claimed in claim 19 wherein, the temperature of air outside the enclosure that is drawn into the enclosure is measured.

22. A method as claimed in claim 19 wherein, which includes communicating with a network administrator via a communication port that is controlled by the control signal generated by the service processor.

* * * * *